US006222751B1

(12) United States Patent
Portaluri et al.

(10) Patent No.: US 6,222,751 B1
(45) Date of Patent: Apr. 24, 2001

(54) DRIVER CIRCUIT FOR A POLYPHASE DC MOTOR WITH MINIMIZED VOLTAGE SPIKES

(75) Inventors: Salvatore Portaluri; Alessandro Savo, both of Pavia; Maurizio Nessi, Como; Luigi Eugenio Garbelli, Mapello; Giorgio Sciacca, Pavia, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/571,354

(22) Filed: May 15, 2000

(51) Int. Cl.$^7$ .................................................. H02M 7/5387

(52) U.S. Cl. ........................... 363/132; 363/133; 318/439

(58) Field of Search .................................... 363/132, 133; 318/254, 432, 439; 323/282

(56) References Cited

U.S. PATENT DOCUMENTS 5,469,096 * 11/1995 Nessi et al. .......................... 327/112

* cited by examiner

*Primary Examiner*—Peter S. Wong
*Assistant Examiner*—Gary L. Laxton
(74) *Attorney, Agent, or Firm*—Theodore E. Galanthay; Allen, Dyer Doppelt, Milbrath & Gilchrist, P.A.

(57) ABSTRACT

A driver circuit includes a half-bridge output stage including two transistors with a common terminal for connection as the driver output to a coil of a DC motor. Two amplifiers drive the transistors in the push-pull operation and two capacitors are connected between the driver output and one input of a respective amplifier to form feedback loops for controlling the output slew-rate. Two current generators are selectively connected to an input of either of the amplifiers through respective pairs of switches. A commutation sequencer turns on and off the switches according to a commutation program. Comparators are connected to the drive output for detecting predetermined output voltage conditions and providing the commutation sequencer with signals for conditioning the commutation program as a function of the detected voltage conditions.

20 Claims, 7 Drawing Sheets

30a
30b
30c
HALF BRIDGE DRIVER
HALF BRIDGE DRIVER
s3
s4
s5
s6
26a
26b
26c
OUT
$C_{D1}$
$C_{D2}$
D1
D2
$I_{Min}$
$I_{Mout}$
$V_M$
M1
M2
A1
A2
C1
C2
S1
S2
$G_{SLEW}$
s1
s2
SEQUENCER
PWM 30a
30b
HALF BRIDGE DRIVER
s3
s4
26b
s5
s6
HALF BRIDGE DRIVER
30c
26c
26a
OUT
$C_{D1}$
D1
$C_{D2}$
D2
$I_{Min}$
$I_{Mout}$
$V_M$
M1
M2
A1
A2
C1
C2
CMP1
CMP2
$G_{SLEW}$
$G_{GATE}$
S1
S2
SG1
SG2
$S_{gnd}$
$S_{VM}$
s1
s2
sg1
sg2
SEQUENCER
PWM
s3 sg3
s4 sg4
s5 sg5
s6 sg6

SEQUENCER
CMP1
CMP2
M1
M2
B1
B2
D1
D2
S1'
S2'
SG
OUT
C
A
sg
s1
s2

DRIVER CIRCUIT FOR A POLYPHASE DC MOTOR WITH MINIMIZED VOLTAGE SPIKES

FIELD OF THE INVENTION

This invention relates to circuitry for use in motor drivers and, more particularly, to a driver circuit for use with a polyphase DC motor.

BACKGROUND OF THE INVENTION

Polyphase DC motors are used in applications, such as disk drives of personal computers, where a high accuracy in position and speed control is required. Such motors are controlled by phase commutation, i.e. by switching off the current on one phase while switching on the current on another phase.

A schematic diagram of a typical DC motor system of this kind is shown in FIG. 1. The system includes a DC motor 12 having a permanent magnet rotor 14 and a stator 16 with three phases 26*a*, 26*b*, 26*c*. A commutator 20 controls the timing and the sequencing of excitation of the three phases in a manner known in the art. Rotor position detectors 103, such as Hall sensors, optical encoders or sensors of back electromotive force, are used for determining commutation instances. A driver 22 controlled by the commutator 20 and connected to a voltage supply 24 provides current flow to the phases. The phase commutation produces electrical transients due to the inductance of the motor coils. Therefore, torque ripples and other undesirable nonlinearities are generated, which result in acoustical noise produced by the motor, motor wear and electromagnetic interference. To ensure a uniform and noise-free operation the driver must be designed to accurately control the turn-on and turn-off slew-rate at the motor coils during commutation.

A known technique to reduce the electric transients from commutation and thus reduce torque ripple and electromagnetic interference is disclosed in U.S. Pat. No. 5,191,269 assigned to SGS-THOMSON Microelectronics, Inc. In this technique, a current integrator is used to control the gates of field-effect drive transistors in such a manner as to reduce the slew-rate at a stator coil when the drive transistor for that coil is turned off.

An application of such technique is shown schematically in FIG. 2. Three half-bridge driver circuits 30*a*, 30*b*, 30*c* drive corresponding coils 26*a*, 26*b*, 26C of a three-phase DC motor connected in the Y configuration. Only one driver circuit is shown in some detail, the other two driver circuits being identical to it. In this example, driver circuit 30*a* has an output stage which comprises two power n-channel MOS field-effect transistors M1 and M2 connected as shown between the positive and negative terminals, $V_M$ and ground, of a power supply. The transistor connected directly to the positive supply terminal, as is M1, is usually referred to as the "high-side driver" and the other transistor, connected directly to the negative supply terminal, as is M2, is usually referred to as the "low-side driver". The source of M1 and the drain of M2 are connected together at a node OUT which is the output terminal of the driver circuit 30*a* and is connected to stator coil 26*a*. Each transistor M1, M2 has a diode D1, D2 connected between source and drain in the direction of reverse conduction relative to the supply terminals. Typically, transistors M1 and M2 are formed on a common semiconductor substrate and diodes D1 and D2 are intrinsic diodes. If transistors are used which have no intrinsic diodes, corresponding separate diodes should be provided to implement the current recirculation function, as known to any person skilled in the art. Two operational transconductance amplifiers A1, A2 have their outputs connected to a respective gate terminal of transistors M1, M2. The non-inverting input of amplifier A1 and the inverting input of amplifier A2 are connected to ground. The inverting input of amplifier A1 is connectable to a constant current generator $G_{SLEW}$ through a first electronic switch S1 and the non-inverting input of amplifier A2 is connectable to the current generator $G_{SLEW}$ through a second electronic switch S2. The inverting input of A1 and the non-inverting input of A2 are connected to the output node OUT of the output stage 30*a* through a respective capacitor C1 and C2. A sequencer 31 generates switching signals s1, s2 for opening and closing electronic switches S1 and S2, as well as switching signals s3, s4 and s5, s6 for opening and closing corresponding switches in the driver circuits 30*b*, 30*c*, according to a predetermined timing. The sequencer 31 and the electronic switches together form a commutator as shown at 20 on FIG. 1.

In operation, a current integrating function is provided to reduce voltage transients at node OUT during commutation. These transients are due to the inability to instantaneously change the current through an inductor, such as through stator coils 26*a*, 26*b*, 26*c*. The current integrating function is implemented by current generator $G_{SLEW}$ and by capacitor C1 or C2 when the corresponding switch S1 or S2 is turned on, with the effect of limiting the voltage slew-rate at output node OUT when transistors M1 and M2 are alternatively turned off and on.

When the motor current is controlled in the Pulse Width Modulation (PWM) mode, the commutation timing is affected by an appropriate signal as represented at input PWM to sequencer 31 in FIG. 2. Typically, only the high side drivers (M1 in FIG. 2) are pulse width modulated while the low side drivers (M2 in FIG. 2) are fully switched on or off according to their commutation sequence timing. In this operating mode a problem arises when the voltage at the output node OUT turns from "low" to "high" with outgoing motor current, as shown by an arrow $I_{Mout}$ in FIG. 2, or from "high" to "low" with incoming motor current, as shown by an arrow $I_{min}$ in in FIG. 2. In this condition a voltage spike appears at the output node which causes perturbances in the supply rails and electromagnetic interference.

To better explain this malfunction reference is made to FIG. 3 where a portion of the arrangement of FIG. 2 is represented in a particular operating condition. More particularly, the situation is considered when switch S1 is turned on and a transition from "low" to "high" must be initiated to cause the motor current to flow from the output node OUT, as shown by arrow $I_{Mour}$. It is important to consider the operating phases which are immediatly preceding this situation. When transistor M1 is on and transistor M2 is off, the inductance of coil 26*a* is charged. Transistor M1 is then switched off while transistor M2 is still off: this causes output node OUT to go to a voltage lower than ground, which in turn results in diode D2 to be forward biased and the coil inductance to begin to discharge through the diode. Transistor M2 is then turned on while transistor M1 is off: the coil inductance is now discharged through the conducting transistor M2 more efficiently than through the diode (in fact the power dissipated through M2 is $Ron \times I^2$, where Ron is the resistance of transistor M2 in conduction, and is lower than $V_{Dfwd} \times I$, where $V_{Dfwd}$ is the voltage across diode D2 in forward conduction). Next, transistor M2 is turned off while transistor M1 is still off. This is the starting condition considered above when the voltage at node OUT should turn from "low" to "high". It should be noted that in this condition a charge is stored into a parasitic capacitor $C_{D2}$ associated to the diode D2.

When transistor M1 starts conducting, current flows not only to the coil 26*a* but also to the capacitor $C_{D2}$ which was charged during the previous current flow from the coil inductance to a negative voltage with respect to ground. As soon as capacitor $CD_2$ is completely discharged, the output node OUT is subjected to a rapid positive voltage transient before the feedback loop comprising capacitor C1 starts a slew-rate control.

FIGS. 4*a* and 4*b* show plots shows a plot of the voltage $V_{OUT}$ at output node OUT as a function of time in two different operating conditions: FIG. 4*a*) in a low-current condition and FIG. 4*b*) in a high-current condition. The time interval from $t_o$ to $t_1$ corresponds to the phase of charging of capacitor $C_{D2}$ and the time $t_2$ corresponds to the start of a slew-rate control. The voltage transient starting at $t_1$can be high enough to cause severe disturbances as mentioned above. The above explanations apply also when the voltage at the output node OUT turns from "high" to "low" with incoming motor current $I_{Min}$. In this case, however, transistor M2 is involved in controlling the output current, the capacitor to be discharged is the parasitic capacitor $C_{D1}$ associated with diode Di and the voltage spike is negative.

SUMMARY OF THE INVENTION

It is an object of the present invention to provide a driver circuit for reducing the commutation transients in a polyphase DC motor.

It is another object to have a controlled slew-rate in every operation condition.

Other objects and advantages of the present invention will be apparent to those of ordinary skill in the art having reference to the following specification and enclosed drawings.

The present invention may be implemented by a driver circuit comprising a half-bridge output stage including a pair of transistors having a common terminal connected to an output terminal of the driver circuit for connection to an inductive load of a DC motor and a power terminal connected to a first and second terminals, respectively, of a power supply. The driver circuit includes a pair of amplifiers connected to drive the transistors of the pair of transistors in the push-pull operation, a pair of capacitors operatively connected between the output terminal of the driver circuit and one input terminal of a respective amplifier of the pair of amplifiers, a first constant current generator selectively connected through a first pair of switches to an input of either of the amplifiers, a second constant current generator selectively connected through a second pair of switches to an input of either of the amplifiers. A commutation sequencer is operatively connected to the first and second pair of switches for turning the switches on and off according to a commutation program and detecting means are connected to the output terminal of the driver circuit for detecting predeterminate voltage conditions at the output terminal of the driver circuit and providing the commutation sequencer with signals for conditioning the commutation program as a function of the detected voltage conditions.

BRIEF DESCRIPTION OF THE PREFERRED EMBODIMENTS

Figure 1:
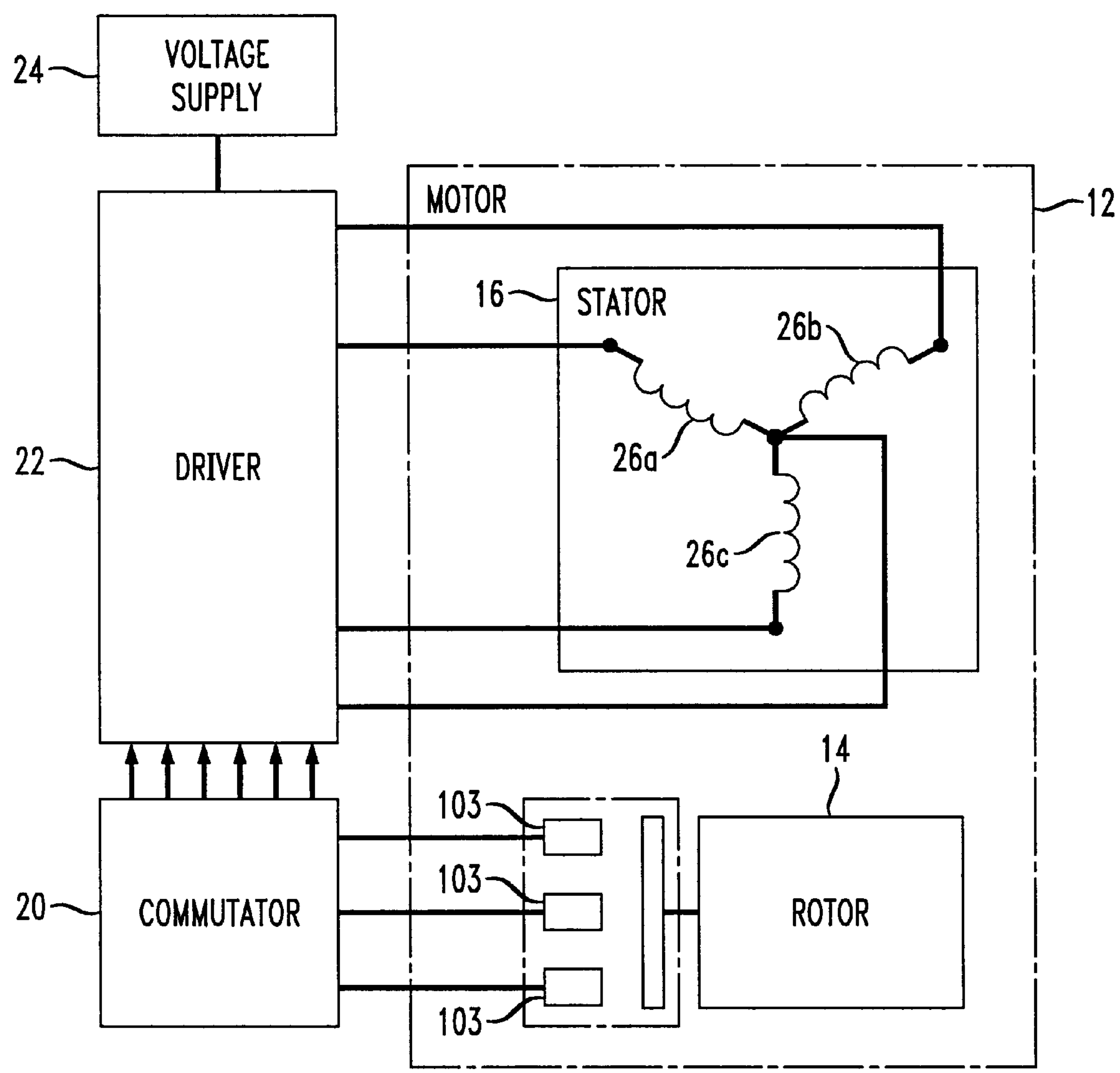
FIG. 1 is a schematic diagram of a DC motor system according to the prior art.
Figure 2:
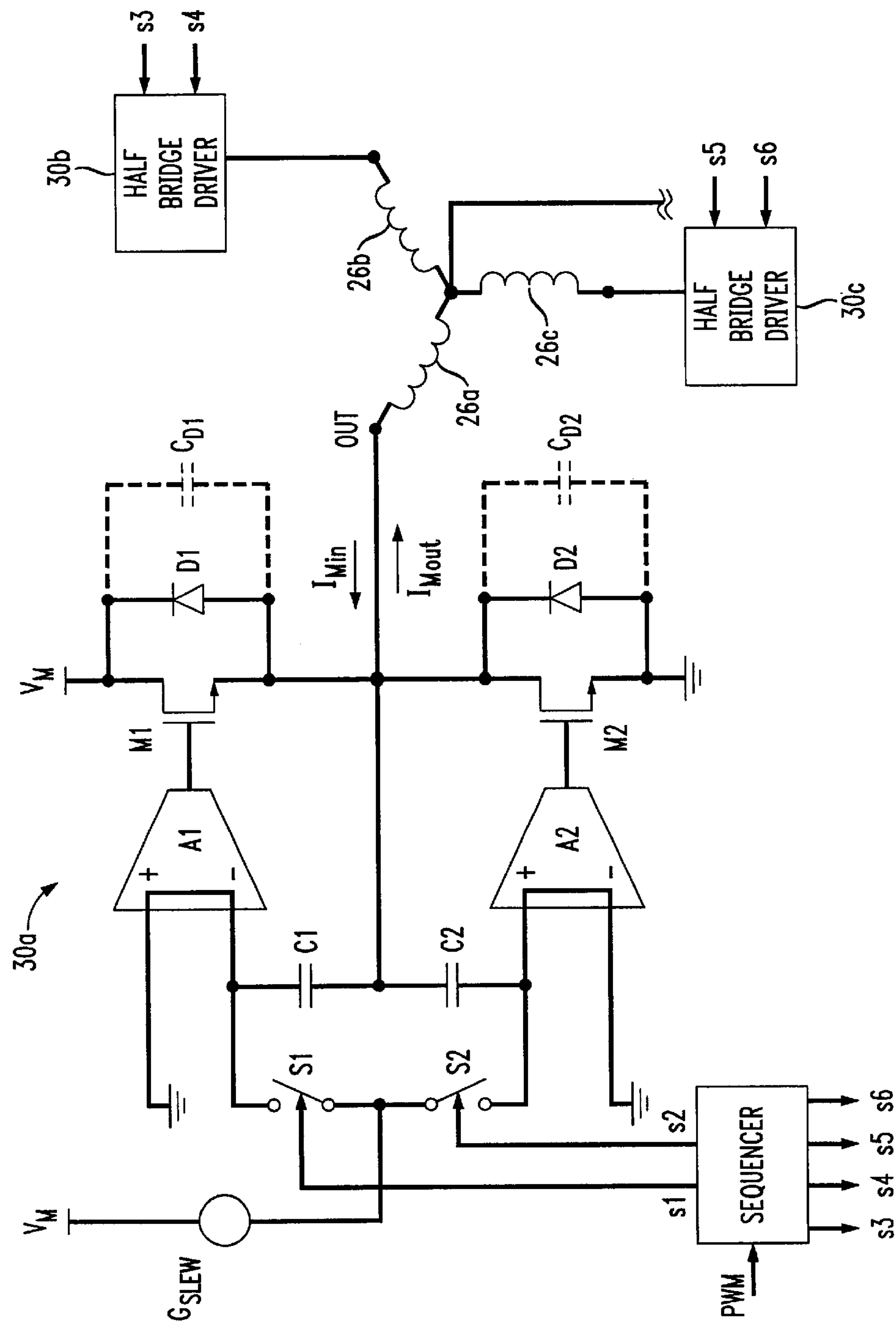
FIG. 2 is a schematic diagram of a driver circuit for a polyphase DC motor according to the prior art.
Figure 4A:
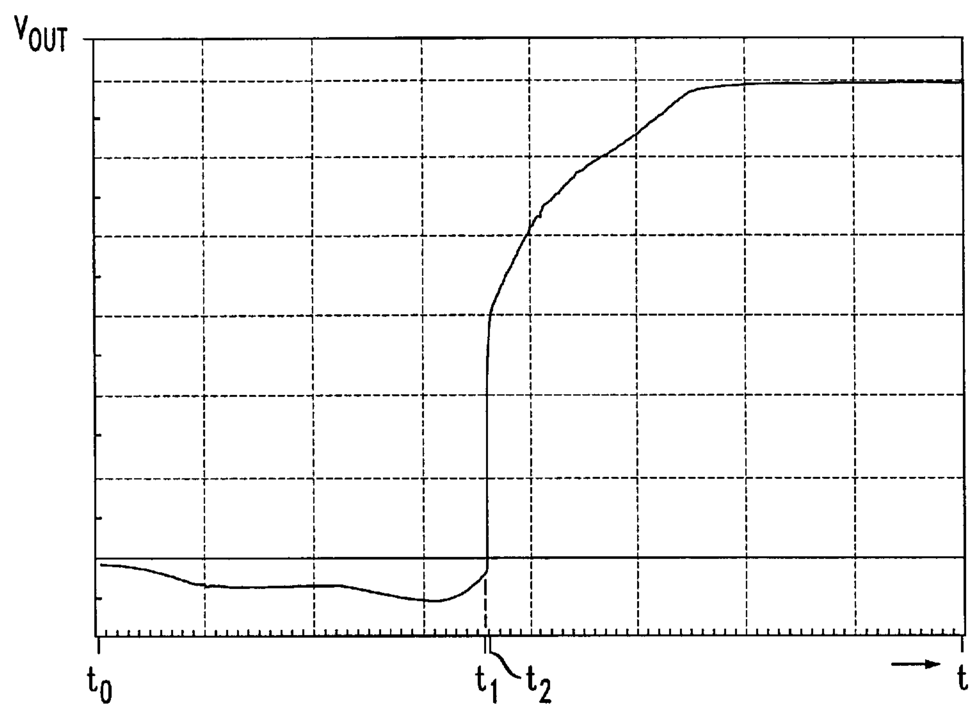
Figure 4B:
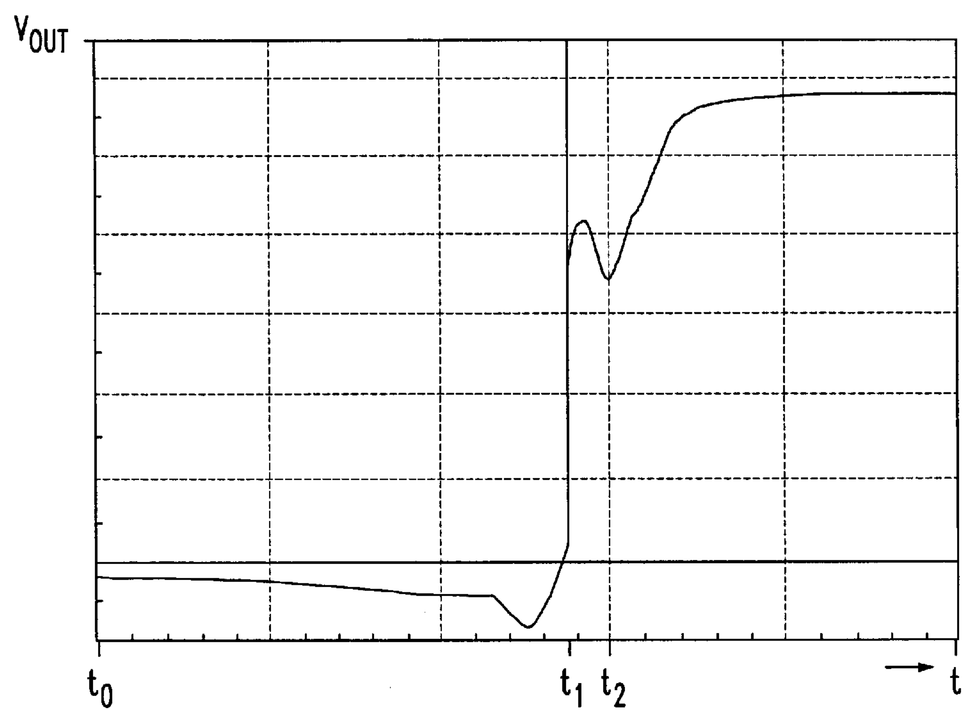

FIGS. 4*a* and 4*b* are is a graphs representing the output voltage of the driver circuit of FIG. 2 as a function of time in two operating conditions.

Figure 5:
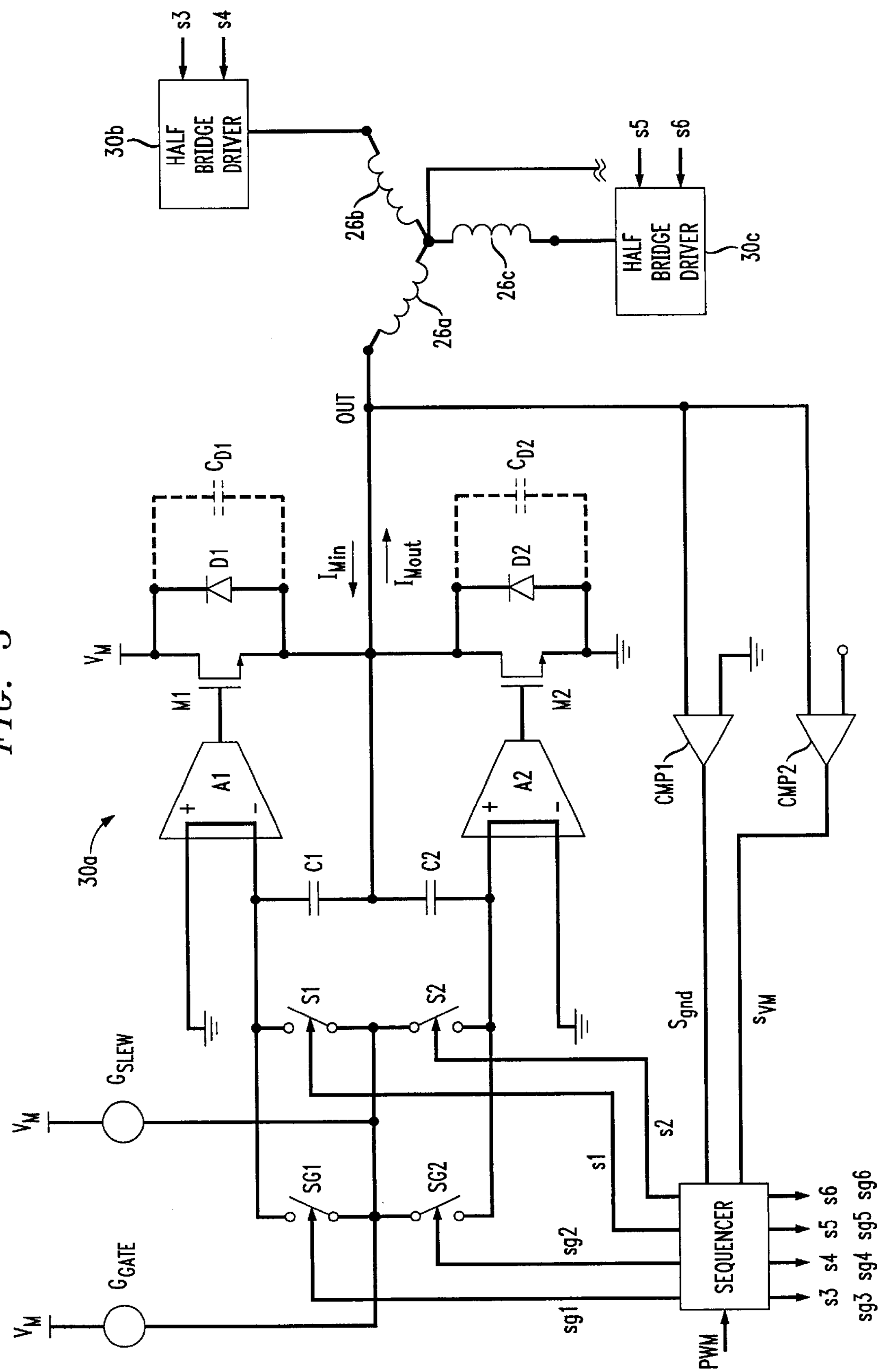

FIG. 5 is a schematic diagram showing in general a preferred embodiment of a driver circuit of the present invention.

Figure 6:
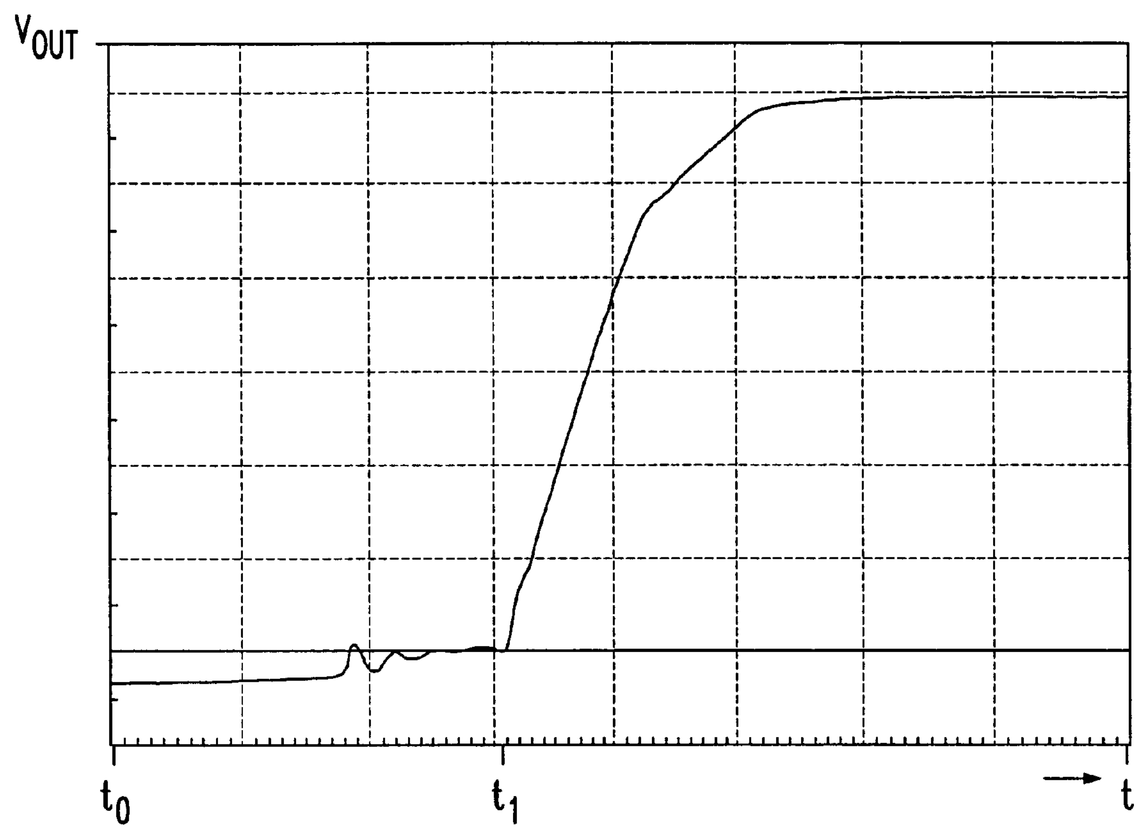

FIG. 6 is a graph representing the output voltage of the driver circuit of FIG. 5 as a function of time.

Figure 7:
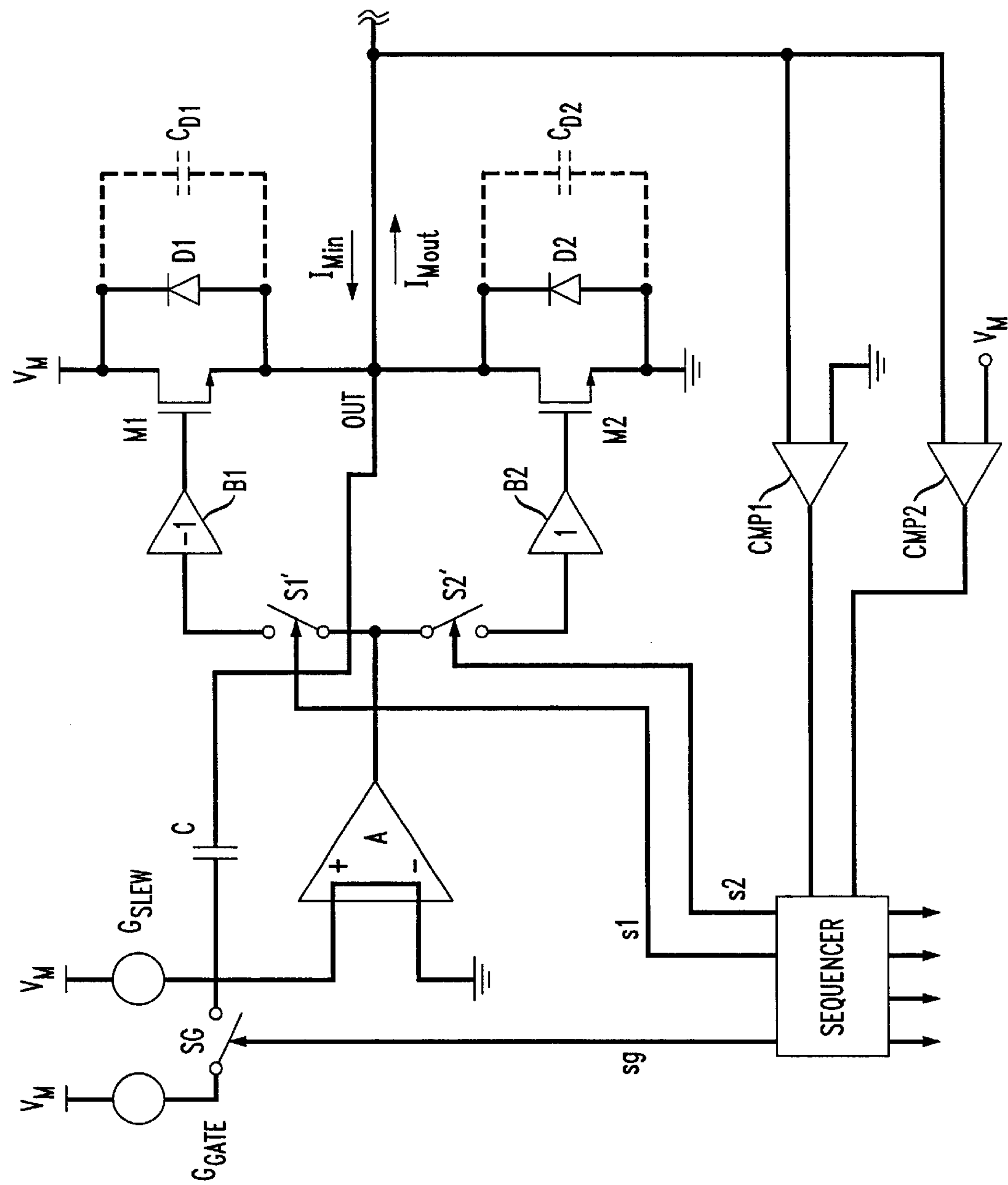

FIG. 7 is a schematic diagram of an alternative embodiment of the present invention.

DETAILED DESCRIPTION OF THE PREFERRED EMBODIMENTS

In the Figures of the drawings like reference numerals are used to denote like or similar parts.

With reference to FIG. 5, the driver circuit according to the invention, as compared to the prior art driver circuit shown in FIG. 2, has two additional electronic switches SG1 and SG2, an additional constant current generator $G_{GATE}$ and two voltage comparators CMP1 and CMP2. The inverting input of amplifier A1 is connectable to the current generator $G_{GATE}$ through switch SG1 and the non-inverting input of amplifier A2 is connectable to the current generator $G_{GATE}$ through switch SG2. The sequencer 31 generates both switching'signals s1–s6 for operating the electronic switches S1–S6 as in the prior art driver circuit of FIG. 2 and switching signals sg1–sg6 for operating the additional electronic switches SG1 and SG2, as well as corresponding additional switches, not shown, in driver circuits 30*b* and 30*c*. The comparators CMP1 and CMP2 have first inputs connected together to the output node OUT of the driver circuit, second inputs connected to the negative (ground) and positive ($V_M$) terminals of the power supply, respectively, and outputs connected to the sequencer 31.

Figure 3:
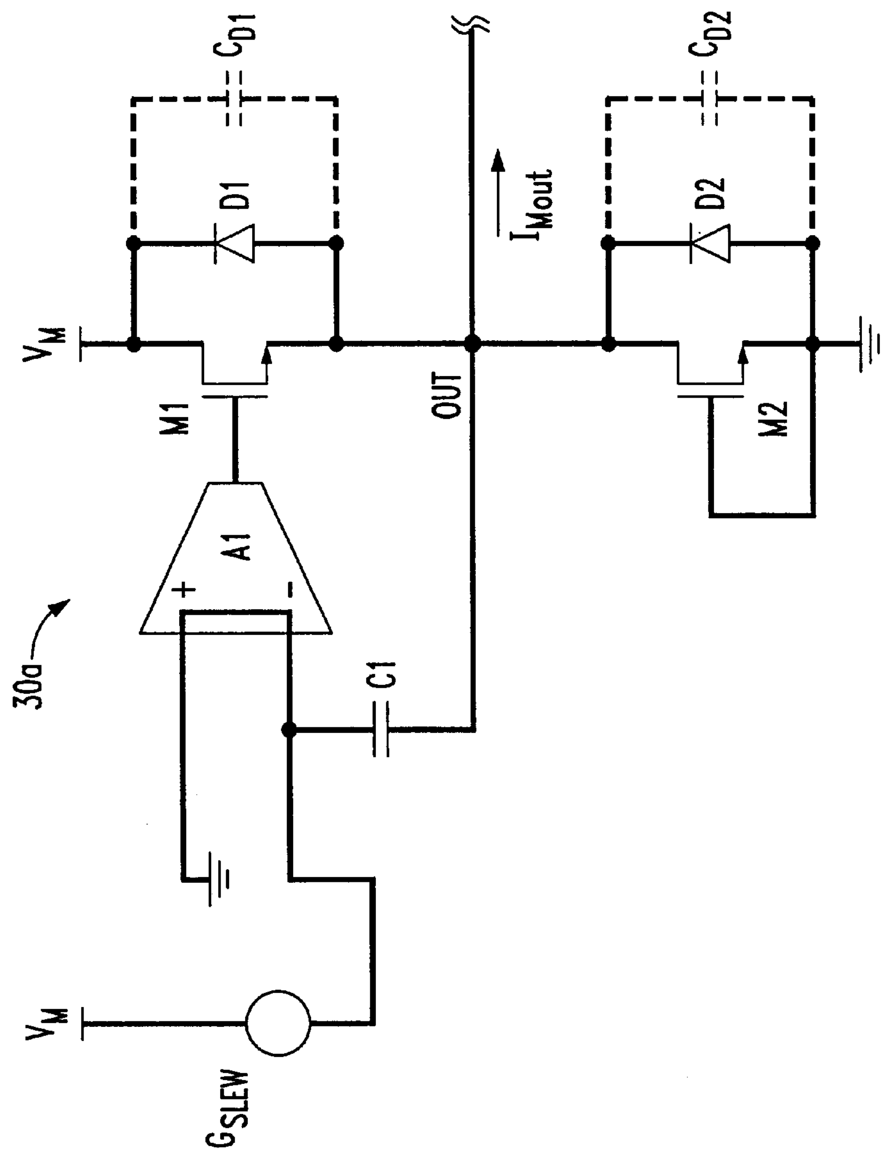
FIG. 3 is a schematic diagram of a driver circuit as shown in FIG. 2 modified to show a specific operating phase.

To explain the operation of the driver circuit according to the invention, reference is made to the operating condition described in connection with FIG. 3, namely when transistor M1 is switched off while transistor M2 is still off before a transition from "low" to "high" is initiated to cause a current $I_{Mout}$ to flow from the output node OUT. As explained, in this condition the output node OUT goes to a voltage lower than ground, diode D2 is forward-biased, transistor M2 is turned on and then off again, while transistor M1 is still off. Now, sequencer 31 generates a signal sg1 to turn switch SG1 on. Current from generator $G_{GATE}$ flows through the closed switch SG1 to the inverting input of amplifier A1, thus causing a small current to be provided to the gate of transistor M1. This has the effect of causing transistor M1 to slowly begin conducting. As soon as the voltage at the output node OUT crosses zero voltage, i.e. raises from a negative to a positive potential, comparator CMP1 generates an output signal $S_{gnd}$. As a result, the sequencer 31 generates a signal s1 to close switch S1, thus activating the slew-rate control loop. At this stage capacitor $C_{D2}$ is charged, so that a positive voltage transient at the output node OUT is prevented, or at least strongly attenuated. As shown in the graph of FIG. 6 the slew-rate is accurately controlled immediately after the time $t_1$when the capacitance $C_{D2}$ associated to diode D2 has been completely charged.

The same effect is reached when the voltage at the output node OUT turns from "high" to "low" with incoming motor current $I_{Min}$. In this case comparator CMP2 is activated, instead of comparator CMP1, when the voltage at its first input is higher than the supply voltage $V_M$ and a signal $S_{VM}$ is provided to the sequencer 31, which in turn causes the switch SG2 to turn on by means of a signal sg2.

The timing and sequencing of the switching signals must be accurately controlled in a manner know per se by a suitable logic circuit and/or program in the sequencer 31, taking into account the conditioning effect of the signals $S_{gnd}$ and $S_{VM}$ from comparators CMP1 and CMP2. As a final result of the operation of the driver circuit according to the invention, no perturbances in the supply rails and no electromagnetic interference are generated.

The embodiment of the invention shown in FIG. 7 includes a modification according to a technique described in U.S. Pat. No. 5,469,096 issued Nov. 21, 1995, assigned to SGS-THOMSON Microelectronics S.r.l., entitled "Power-transistor slew-rate controller employing only a single capacitor per half-bridge" and incorporated herein by this reference. This embodiment employs a single capacitor C and a single transconductance amplifier A for controlling a push-pull output stage including a transistor pair M1, M2. The capacitor C is connected between the output terminal OUT and the non-inverting input amplifier A which is also connected to a constant current generator $G_{SLEW}$. A pair of electronic switches S1' and S2' connect selectively the output of amplifier A to the gates of transistors M1, M2 through an inverting buffer B1 and a non-inverting buffer B2. Another constant current generator $G_{GATE}$ is connected to the non-inverting input of amplifier A through an electronic switch SG. The switches S1', S2' and SG are controlled by signals s1, s2 and sg generated by a sequencer 31' according to a commutation program similar to that used for the driver circuit of FIG. 5. This embodiment is based on the recognition that transistors M1 and M2 must operate alternately and has the advantage that two components (a capacitor and an amplifier) are omitted as compared to the embodiment of FIG. 5. The operation is in principle the same as explained above for FIG. 5.

That which is claimed:

1. A driver circuit for a polyphase DC motor having an inductive load comprising:

a power supply having first and second terminals;

an output terminal;

a half-bridge output stage including a pair of transistors having a common terminal connected to the output terminal for connection to the inductive load of the DC motor, and each having a power terminal connected to the first and second terminals, respectively, of the power supply;

a pair of amplifiers connected to drive the pair of transistors in a push-pull operation;

a pair of capacitors each operatively connected between the output terminal and a respective amplifier of the pair of amplifiers;

a first pair of switches connected to inputs of the amplifiers;

a second pair of switches connected to the inputs of the amplifiers;

a first constant current generator selectively connected to either of the amplifiers via the first pair of switches;

a second constant current generator selectively connected to either of the amplifiers via the second pair of switches;

a commutation sequencer operatively connected to the first and second pairs of switches for turning the switches on and off according to a commutation program; and a detecting circuit connected to the output terminal for detecting predetermined voltage conditions at the output terminal and providing the commutation sequencer with signals for conditioning the commutation program as a function of detected voltage conditions.

2. A driver circuit according to claim 1, wherein the detecting circuit includes two comparators, each comparator having a first terminal connected to the output terminal, a second terminal connected to one of the first and second terminals of the power supply, and an output terminal connected to the commutation sequencer; and wherein the predetermined voltage conditions at the output terminal include an output voltage crossing voltages at the first and second supply terminals.

3. A driver circuit for a motor comprising:

a power supply;

an output terminal for connection to the motor;

a half-bridge output stage including a pair of transistors connected between the output terminal and the power supply;

a pair of amplifiers connected to drive the pair of transistors;

a pair of capacitors each operatively connected between the output terminal and a respective amplifier of the pair of amplifiers;

a first pair of switches connected to inputs of the amplifiers;

a second pair of switches connected to the inputs of the amplifiers;

a first constant current generator selectively connected to either of the amplifiers via the first pair of switches;

a second constant current generator selectively connected to either of the amplifiers via the second pair of switches;

a commutation sequencer operatively connected to the first and second pairs of switches for turning the switches on and off according to a commutation program; and a detecting circuit connected to the output terminal for detecting voltage conditions at the output terminal and providing the commutation sequencer with signals for the commutation program.

4. A driver circuit according to claim 3, wherein the pair of amplifiers drive the pair of transistors in a push-pull operation.

5. A driver circuit according to claim 3, wherein the pair of transistors are connected to the output terminal via a common terminal.

6. A driver circuit according to claim 3, wherein the detecting circuit includes two comparators connected between the output terminal, the power supply, and the commutation sequencer; and wherein the voltage conditions at the output terminal include voltage crossings.

7. A driver circuit for a polyphase DC motor having an inductive load, the driver circuit comprising:

a power supply having first and second terminals;

an output terminal;

a half-bridge output stage including a pair of transistors having a common terminal connected to the output terminal for connection to the inductive load of the DC motor, and a power terminal connected to the first and second terminals, respectively, of the power supply;

a pair of switches;

an amplifier connected to selectively drive the pairs of transistors in a push-pull operation via the pair of switches;

a capacitor operatively connected between the output terminal and a first input of the amplifier;

a first constant current generator connected to the first input of the amplifier;

a third switch;

a second constant current generator selectively connected via the third switch to the first input of the amplifier;

a commutation sequencer operatively connected to the pair of switches and to the third switch for turning the switches on and off according to a commutation program; and a detecting circuit connected to the output terminal for detecting predetermined voltage conditions at the output terminal and providing the commutation sequencer with signals for conditioning the commutation program as a function of the detected voltage conditions.

8. A driver circuit according to claim 7, wherein the detecting circuit includes two comparators, each comparator having a first terminal connected to the output terminal, a second terminal connected to one of the first and second terminals of the power supply, and an output terminal connected to the commutation sequencer; and wherein the predetermined voltage conditions at the output terminal of the driver circuit include an output voltage crossing voltages at the first and second supply terminals.

9. A driver circuit for a motor comprising:

a power supply;

an output terminal for connection to the motor;

a half-bridge output stage including a pair of transistors connected between the output terminal and the power supply;

a pair of switches;

an amplifier connected to selectively drive the pairs of transistors via the pair of switches;

a capacitor operatively connected between the output terminal and the amplifier;

a first constant current generator connected to the amplifier;

a third switch;

a second constant current generator selectively connected via the third switch to the amplifier;

a commutation sequencer operatively connected to the pair of switches and to the third switch for turning the switches on and off according to a commutation program; and a detecting circuit connected to the output terminal for detecting voltage conditions and providing the commutation sequencer with signals for the commutation program.

10. A driver circuit according to claim 9, wherein the pair of amplifiers drive the pair of transistors in a push-pull operation.

11. A driver circuit according to claim 9, wherein the pair of transistors are connected to the output terminal via a common terminal.

12. A driver circuit according to claim 9, wherein the detecting circuit includes two comparators connected to the output terminal, to the power supply, and to the commutation sequencer; and wherein the voltage conditions at the output terminal include voltage crossings.

13. A method for driving a motor comprising:

providing a half-bridge output stage including a pair of transistors connected between an output terminal and a power supply;

driving the pair of transistors via a pair of amplifiers;

connecting a capacitor between the output terminal and each of the pair of amplifiers;

selectively connecting a first constant current generator to either of the amplifiers via a first pair of switches;

selectively connecting a second constant current generator to either of the amplifiers via a second pair of switches;

turning the first and second pairs of switches on and off according to a commutation program via a commutation sequencer; and detecting voltage conditions at the output terminal via a detecting circuit for providing the commutation sequencer with signals for the commutation program.

14. A method according to claim 13, wherein the pair of amplifiers drive the pair of transistors in a push-pull operation.

15. A method according to claim 13, wherein the pair of transistors are connected to the output terminal via a common terminal.

16. A driver circuit according to claim 13, wherein the detecting circuit includes two comparators connected between the output terminal, the power supply, and the commutation sequencer; and wherein the voltage conditions at the output terminal include voltage crossings.

17. A method for driving a motor comprising:

providing a half-bridge output stage including a pair of transistors connected between an output terminal and a power supply;

selectively driving the pairs of transistors with an amplifier via a pair of switches;

connecting a capacitor between the output terminal and the amplifier;

connecting a first constant current generator to the amplifier;

selectively connecting a second constant current generator to the amplifier via a third switch;

turning the pair of switches and the third switch on and off according to a commutation program of a commutation sequencer; and detecting voltage conditions at the output terminal via a detecting circuit for providing the commutation sequencer with signals for the commutation program.

18. A method according to claim 17, wherein the pair of amplifiers drive the pair of transistors in a push-pull operation.

19. A method according to claim 17, wherein the pair of transistors are connected to the output terminal via a common terminal.

20. A method according to claim 17, wherein the detecting circuit includes two comparators connected to the output terminal, to the power supply, and to the commutation sequencer; and wherein the voltage conditions at the output terminal include voltage crossings.

* * * * *

UNITED STATES PATENT AND TRADEMARK OFFICE

CERTIFICATE OF CORRECTION

PATENT NO. : 6,222,751 B1
DATED : April 24, 2001
INVENTOR(S) : Salvatore Portaluri, Alessandro Savo, Maurizio Nessi, Luigi Eugenio Garbelli, Giorgio Sciacca It is certified that error appears in the above-identified patent and that said Letters Patent is hereby corrected as shown below:

Column 3,
Line 7, delete "$CD_2$", insert -- $C_{D2}$ --
Line 11, delete "show plots shows a plot", insert -- show plots --

Column 4,
Line 3, delete "are is a graphs", insert -- are graphs --

Signed and Sealed this

Eleventh Day of December, 2001

*Attest:*

NICHOLAS P. GODICI

*Attesting Officer*

*Acting Director of the United States Patent and Trademark Office*